(12) United States Patent
Weis et al.

(10) Patent No.: US 12,288,819 B2
(45) Date of Patent: Apr. 29, 2025

(54) FILL PATTERN FOR POWER TRANSISTOR AND DIODE DEVICES

(71) Applicant: Infineon Technologies Dresden GmbH & Co. KG, Dresden (DE)

(72) Inventors: Rolf Weis, Dresden (DE); Ahmed Mahmoud, Freising (DE); Marco Mueller, Pirna (DE)

(73) Assignee: Infineon Technologies Dresden GmbH & Co. KG, Dresden (DE)

( * ) Notice: Subject to any disclaimer, the term of this patent is extended or adjusted under 35 U.S.C. 154(b) by 705 days.

(21) Appl. No.: 17/479,487

(22) Filed: Sep. 20, 2021

(65) Prior Publication Data

US 2022/0093792 A1    Mar. 24, 2022

Related U.S. Application Data

(60) Provisional application No. 63/080,933, filed on Sep. 21, 2020.

(51) Int. Cl.
| | |
|---|---|
| *H01L 29/78* | (2006.01) |
| *H01L 29/06* | (2006.01) |
| *H01L 29/08* | (2006.01) |
| *H01L 29/10* | (2006.01) |
| *H01L 29/66* | (2006.01) |

(52) U.S. Cl.
CPC ...... *H01L 29/7823* (2013.01); *H01L 29/0696* (2013.01); *H01L 29/0878* (2013.01); *H01L 29/1095* (2013.01); *H01L 29/66681* (2013.01)

(58) Field of Classification Search
CPC ............. H01L 27/0727; H01L 29/0634; H01L 29/0653; H01L 29/0692; H01L 29/1066; H01L 29/404; H01L 29/7393; H01L 29/7835; H01L 29/808
USPC ........................................................ 257/337
See application file for complete search history.

(56) References Cited

U.S. PATENT DOCUMENTS

| | | |
|---|---|---|
| 5,534,721 A | 7/1996 | Shibib |
| 6,097,063 A | 8/2000 | Fujihira |
| 9,236,449 B2 | 1/2016 | Ellis-Monaghan et al. |
| 9,312,381 B1 | 4/2016 | Bobde et al. |
| 9,450,045 B1 | 9/2016 | Bobde et al. |
| 9,991,380 B2 | 6/2018 | Bobde et al. |
| 2005/0285189 A1* | 12/2005 | Shibib ............... H01L 29/66659 257/E29.12 |
| 2006/0113601 A1* | 6/2006 | Shibib ................. H01L 29/7835 257/E29.264 |
| 2006/0113625 A1* | 6/2006 | Bude ................... H01L 29/7835 257/493 |

(Continued)

*Primary Examiner* — Fazli Erdem
(74) *Attorney, Agent, or Firm* — Murphy, Bilak & Homiller, PLLC

(57) ABSTRACT

According to an embodiment of a semiconductor device, the device includes: a transistor or diode device formed in a semiconductor substrate; an insulating material at least partially covering a lateral drift zone of the transistor or diode device or a termination region; and a fill pattern disposed over the lateral drift zone or termination region, the fill pattern having a variable density that follows equipotential lines of an electric field distribution expected between the fill pattern at a surface of the lateral drift zone or termination region during operation of the semiconductor device. Corresponding methods of producing the semiconductor device are also described.

32 Claims, 13 Drawing Sheets

(56) References Cited

U.S. PATENT DOCUMENTS

| | | |
|---|---|---|
| 2011/0127586 A1 | 6/2011 | Bobde et al. |
| 2014/0227837 A1 | 8/2014 | Bobde et al. |
| 2016/0308037 A1 | 10/2016 | Sakata |
| 2017/0092716 A1 | 3/2017 | Mauder et al. |
| 2017/0222043 A1 | 8/2017 | Hirler et al. |
| 2021/0043361 A1* | 2/2021 | Osada ................ H01F 27/2885 |

* cited by examiner

FILL PATTERN FOR POWER TRANSISTOR AND DIODE DEVICES

BACKGROUND

Integrating high voltage transistor devices such as lateral high-voltage MOS (HVMOS) transistors with low voltage logic devices such as controllers and other system functionalities reduces system cost. HVMOS devices block high voltages with an elongated drift zone. The drift zone may be viewed as an extension of the drain, but with lower doping. The drift zone together with the body (substrate) and drain terminals form a pn-diode in the off-state of the device. The length of the drift zone is determined by the maximal target blocking voltage. The longer the drift zone, the higher the breakdown voltage of the device. For example, a drift zone having a length of about 1 to 2 μm provides for a breakdown voltage of about 20V. A drift zone having a length of about 100 μm provides for a breakdown voltage above 1000V.

When combining lateral HVMOS devices with CMOS-based logic having small ground rules, the elongated drift zone area must be planarized using CMOS-like processing steps just like all other logic areas to maintain depth of focus for lithographic operations and to ensure a good quality surface interface. Typically, there are certain fill structures to achieve a sufficient pattern density for planarization processes like CMP (chemical mechanical polishing). Due to the large length of the drift zone, fill structures must be inserted also in the drift zone area. Otherwise, a surface interface with low integrity results. For example, in the case of CMP, dishing results above the drift zone area if fill structures are not used. Unfortunately, typical fill structures defined for logic areas are not suitable for the drift zone area of a high voltage transistor device, as they change the electric-field distribution unfavorably. High voltage transistor devices are designed with an expected electric-field distribution at the surface of the drift area that ensures safe and reliable operation of the device. Altering the expected electric-field distribution by the use of fill structures is problematic and requires the drift zone to be made even longer which increases the on-resistance of the device.

Thus, there is a need for a fill structure which is electrically compatible with the electric-field distribution in the drift zone area of a high voltage transistor device.

SUMMARY

According to an embodiment of a semiconductor device, the semiconductor device comprises: a transistor or diode device formed in a semiconductor substrate; an insulating material at least partially covering a lateral drift zone of the transistor or diode device or a termination region; and a fill pattern disposed over the lateral drift zone or termination region, the fill pattern having a variable density that follows equipotential lines of an electric field distribution expected between the fill pattern at a surface of the lateral drift zone or termination region during operation of the semiconductor device.

According to an embodiment of a method of producing a semiconductor device, the method comprises: forming a transistor or diode device in a semiconductor substrate; at least partially covering a lateral drift zone of the transistor or diode device or a termination region with an insulating material; and forming a fill pattern over the lateral drift zone or termination region, the fill pattern having a variable density that follows equipotential lines of an electric field distribution expected between the fill pattern at a surface of the lateral drift zone or termination region during operation of the semiconductor device.

According to another embodiment of a semiconductor device, the semiconductor device comprises: a transistor or diode device formed in a semiconductor substrate, the transistor or diode device comprising a lateral drift zone; a shallow trench isolation structure formed in the lateral drift zone; and a fill pattern in the shallow trench isolation structure and disposed over the lateral drift zone, the fill pattern having a variable density that follows equipotential lines of the electric field distribution expected between the fill pattern at a surface of the lateral drift zone during operation of the semiconductor device.

According to another embodiment of a semiconductor device, the semiconductor device comprises: a transistor or diode device formed in a semiconductor substrate; an insulating material at least partially covering a lateral drift zone of the transistor or diode device or a termination region; and a fill pattern disposed over the lateral drift zone or termination region, the fill pattern including a plurality of curvilinear fill structures having a variable width and/or a variable spacing.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Described herein is a fill pattern which is electrically compatible with the electric-field distribution in a lateral drift zone or termination region of a high voltage transistor or diode device formed in a semiconductor substrate. The high voltage transistor or diode device may be integrated with an optional low voltage logic device using the same semiconductor substrate. The terms "high voltage" and "low voltage" mean that a high voltage transistor device operates at a higher voltage than a low voltage logic device. For example, in the case of CMOS technology, a low voltage logic device may be a semiconductor device operating at a supply voltage of less than or equal 32V, e.g. 32V, 24V, 16V, 12V 5 V, 3.3 V, 2.5V or even less or equal to 1.8V or even lower whereas a high voltage transistor or diode device such as a power MOSFET (metal-oxide-semiconductor field effect transistor), JFET (junction FET), IGBT (insulated gate bipolar transistor), HEMT (high electron mobility transistor), power diode, etc. operates at a voltage in the range of 10s of volts, hundreds of volts, or even thousands of volts.

The high voltage transistor or diode device and the optional low voltage logic device may be fabricated in the same semiconductor substrate using CMOS or CMOS-like processing which includes planarization techniques such as CMP. The optional low voltage logic device instead may be omitted. The fill pattern described herein ensures compliance with the ground rules associated with the CMOS or CMOS-like processing used to fabricate the high voltage transistor or diode device and the low voltage logic device. The fill pattern also has a variable density that follows equipotential lines of the electric field distribution expected between the fill pattern at the surface of the lateral drift zone or termination region of the high voltage transistor or diode device during operation of the semiconductor device. The variable density of the fill pattern is designed such that the fill pattern does not adversely interfere with or effect the electric-field distribution in the lateral drift zone or termination region of the high voltage transistor or diode device, ensuring safe and reliable operation of the device. Described next are various embodiments of the fill pattern and corresponding semiconductor devices.

Figure 1A:
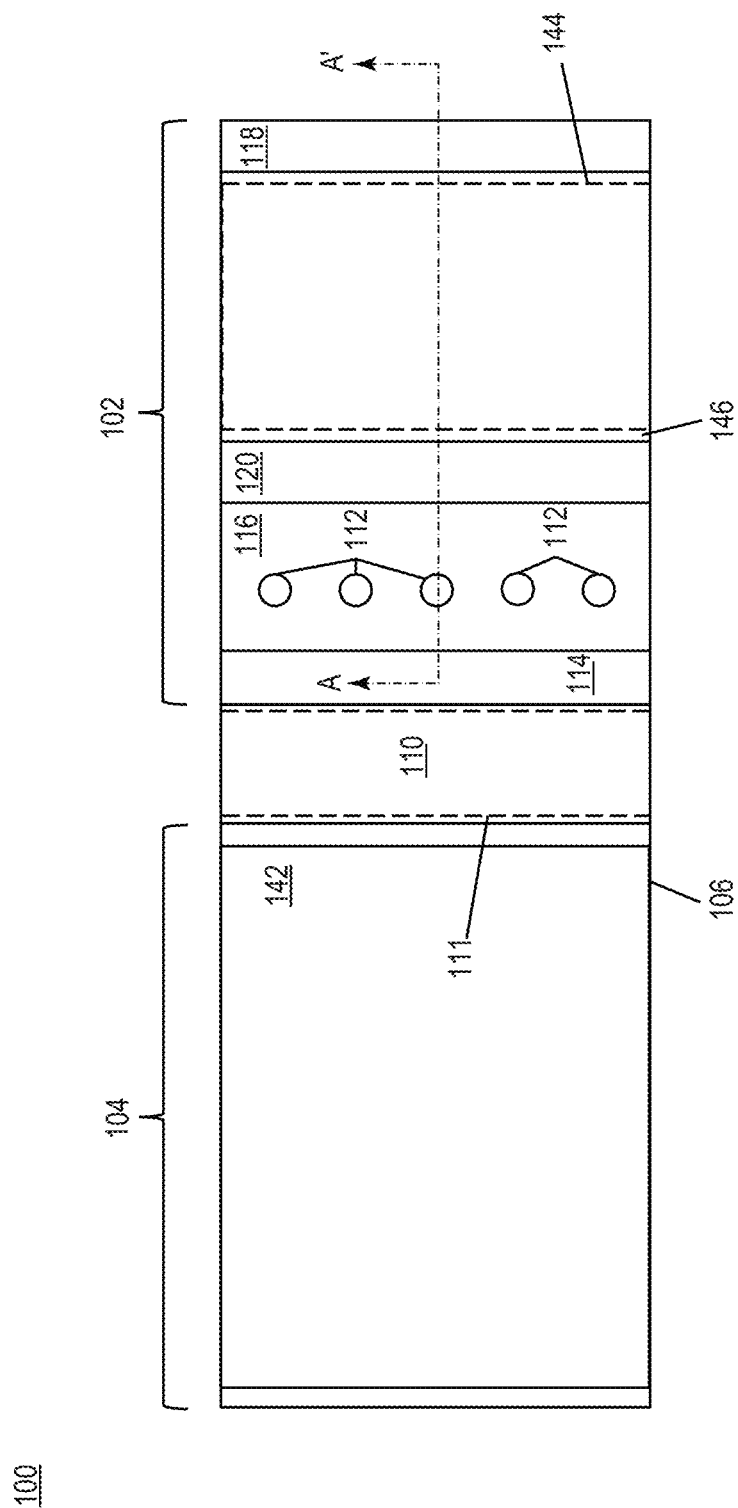
FIG. 1A illustrates a partial top plan view of an embodiment of a semiconductor device that includes a high voltage transistor device and a low voltage logic device integrated in the same semiconductor substrate, and a fill pattern having a variable density that follows equipotential lines of an expected electric field distribution.
Figure 1B:
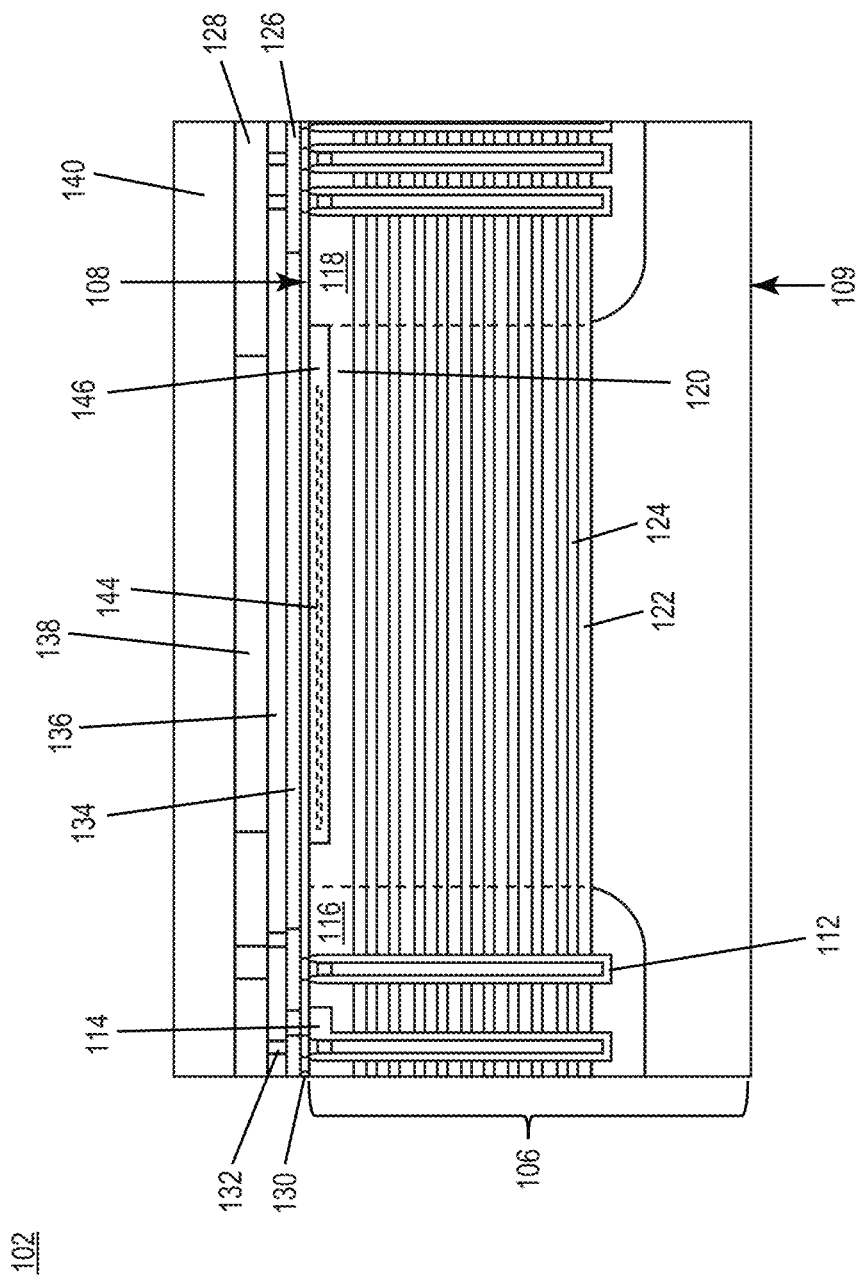
FIG. 1B illustrates a cross-sectional view along the line labelled A-A' in FIG. 1A.

FIG. 1A illustrates a partial top plan view of an embodiment of a semiconductor device 100 that includes a high voltage transistor device 102 and an optional low voltage CMOS-like processed device 104 integrated in the same semiconductor substrate 106. FIG. 1B illustrates a cross-sectional view of the semiconductor device 100 along the line labelled A-A' in FIG. 1A. The partial top plan view of FIG. 1A is taken along the front surface 108 of the semiconductor substrate 106 shown in FIG. 1B.

The semiconductor substrate 106 may comprise any type of semiconductor material suitable for integration of high voltage transistor devices and low voltage logic devices. For example, the semiconductor substrate 106 may comprise Si, SiC, GaN, GaAs, graphene, carbon etc. The semiconductor substrate 106 may comprise a semiconductor base and one or more epitaxial layers grown on the semiconductor base.

The semiconductor substrate 106 includes a termination region 110 between the high voltage transistor device 102 and the optional low voltage logic device 104, or between the high voltage transistor device 102 and the edge of the semiconductor substrate 106. The termination region 110 ensures proper isolation between the high-voltage and low-voltage parts of the device 100, or between the high voltage transistor device 102 and the edge of the semiconductor substrate 106. In one embodiment, the termination region 110 includes a shallow trench isolation (STI) region.

The high voltage transistor device 102 may be a lateral or vertical power transistor. In the case of a lateral power transistor, the main current flow path is along the front surface 108 of the semiconductor substrate 106. In the case of a vertical power transistor, the main current flow path is between the front surface 108 and the back surface 109 of the semiconductor substrate 106 but may have a lateral drift zone component.

For example, as shown in FIGS. 1A and 1B, the high voltage transistor device 102 may be a lateral JFET having gate structures 112 which extend from the front surface 108 into the semiconductor substrate 106, a source region 114, a body region 116 surrounding the source region 114, and a drain region 118 laterally separated from the body region 116 by a lateral drift zone 120. The source region 114, drain region 118 and lateral drift zone 120 are of a first conductivity type, and the gate structures 112 and body region 116 are of a second conductivity type opposite the first conductivity type. In the case of an n-channel transistor, the first conductivity type is n-type and the second conductivity type is p-type. In the case of a p-channel transistor, the first conductivity type is p-type and the second conductivity type is n-type. In either case, the lateral JFET may further include a superjunction (SJ) structure comprising alternating horizontal layers 122, 124 of the opposite conductivity type. The superjunction structure enables the high voltage transistor device 102 to block its full voltage by balancing additional charge in the lateral drift zone 120 (e.g. n-charge for an n-channel device) by adjacently positioned regions of the opposite conductivity type (e.g. p-type for an n-channel device).

The gate structures 112 of the second conductivity type are electrically connected to gate potential, the source and body regions 114, 116 are electrically connected to source potential, and the drain region is electrically connected to drain potential. These connections are provided by one or more metallization layers 126, 128 and via layers 130, 132 formed above the semiconductor substrate 106 and insulated from one another and from the semiconductor substrate 106 by corresponding interlayer dielectrics 134, 136, 138. A passivation layer 140 may be formed over the uppermost metallization layer 128 for protecting the device 102. The number of metallization layers depends on the wiring complexity of the semiconductor device 100.

On one side of the JFET gate structures 112, a pn-junction between the source region 114 and the oppositely doped gate structures 112 can be depleted by a sufficiently high gate voltage and a JFET structure is formed on the other side of the gate structures 112. If a negative gate voltage is applied, the JFET area is depleted between the SJ regions 122 of the first conductivity type. This depletion region can be switched on and off by the JFET structure.

Another type of power transistor may be used instead of a JFET. For example, the high voltage transistor device 102 may instead be a power MOSFET, vertical or lateral with a lateral drift area, an IGBT, a HEMT, etc. For these types of power transistor devices, an insulated gate may be formed on the front surface 108 of the semiconductor substrate 106 in the case of a planar gate device or in trenches formed in the semiconductor substrate 106 in the case of a trench gate device. In yet another embodiment, the high voltage device 102 may be a diode with the lateral drift zone 120 disposed between the anode and cathode of the diode.

The optional low voltage logic device 104 may be a gate driver circuit for the high voltage transistor device 102. The low voltage logic device 104 may also include a controller for the gate driver circuit. For example, the high voltage transistor device 102 may form part of a half bridge or full bridge rectifier. The low voltage logic device 104 may include the gate driver circuit for driving the gate of the high voltage transistor device 102 and may also include the controller functionality for controlling the gate driver circuit. In addition or alternatively, the low voltage logic device 104 may include an ASIC (application-specific integrated circuit), memory, etc. In general, the low voltage logic device 104 includes an active area 142 within the semiconductor substrate 106 and having individual transistors which are interconnected by one or more of the metallization layers 126, 128 to form the low voltage logic device 104. The low voltage logic device 104 may be omitted, as explained above.

FIG. 1B shows a partial cross-sectional view of just the high voltage transistor device 102 since emphasis is placed on a fill pattern 144 formed over the lateral drift zone 120 of the high voltage transistor device 102. One of ordinary skill in the art will understand that any type of logic circuitry may be formed in the active area 142 of the low voltage logic device 104, or the low voltage logic device 104 may be omitted. Accordingly, details relating to the type of low voltage logic device are discussed only briefly. Emphasis instead is placed on the fill pattern 144.

According to the embodiment shown in FIGS. 1A and 1B, an insulating material 146 at least partially covers the lateral drift zone 120 of the high voltage transistor device 102. In one embodiment, the insulating material 146 is a region of STI formed in the lateral drift zone 120 at the front surface 108 of the semiconductor substrate 106. The fill pattern 144 is formed in the insulating material 146 disposed over the lateral drift zone 120. The fill pattern 144 has a variable density that coincides with an electric field distribution expected between the fill pattern 144 at the surface 108 of the lateral drift zone 120 during operation of the semiconductor device 100. In addition or separately, the fill pattern 140 may be formed in the insulating material 111 disposed over the termination region 110 between the high voltage transistor device 102 and the low voltage logic device 104 and has a variable density that follows the equipotential lines of an electric field distribution expected between the fill pattern 144 at the surface 108 of the termination region 110 during operation of the semiconductor device 100.

In each case, the electric field distribution is directed away from a lateral edge (out of view) of the semiconductor substrate 106 and toward the front surface 108 of the substrate 106 to ensure safe operation of the device 100. The lateral edge is the side surface of the semiconductor substrate 106 that is cut by sawing, laser, etc., to separate the semiconductor device 100 from other devices fabricated from the same semiconductor wafer. The fill pattern 144 disposed over the lateral drift zone 120 and/or the termination region 110 has a density that follows the equipotential lines of the expected electric field at the surface 108 of the lateral drift zone 120 and/or termination region 110, so that the electric field is not disturbed by the fill pattern 144.

The primary purpose of the fill pattern 144 is to ensure sufficient pattern density over large areas of relatively uniform density such as the lateral drift zone 120 and the termination region 110, so that standard planarization processes such as CMP may be utilized when forming the high voltage transistor device 102 and optionally the low voltage logic device 104 integrated in the semiconductor substrate 106. CMP is a standard planarization process used in CMOS processing, and absent sufficient pattern density over large areas of relatively uniform density such as the lateral drift zone 120 and/or the termination region 110, poor surface integrity results in these areas of the semiconductor device 100. For example, in the case of CMP, this may result in dishing and other issues over the lateral drift zone 120 which may have a (horizontal) length up to 10s of microns (um), 100 um or ever greater. The termination region 110 is also relatively large with relatively uniform density compared to other regions of the semiconductor device 100. The fill pattern 144 provides sufficient pattern density over the lateral drift zone 120 and/or the termination region 110 without disturbing the electric field, i.e., the fill pattern 144 follows the equipotential lines expected between the fill pattern 144 at the surface 108 of the lateral drift zone 120 and/or termination region 110.

Figure 2:
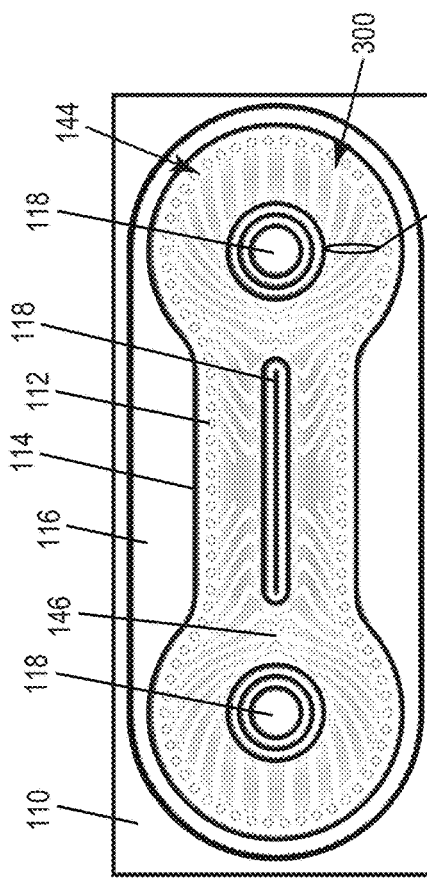
FIG. 2 illustrates a top plan view of the fill pattern, according to an embodiment.
Figure 3:
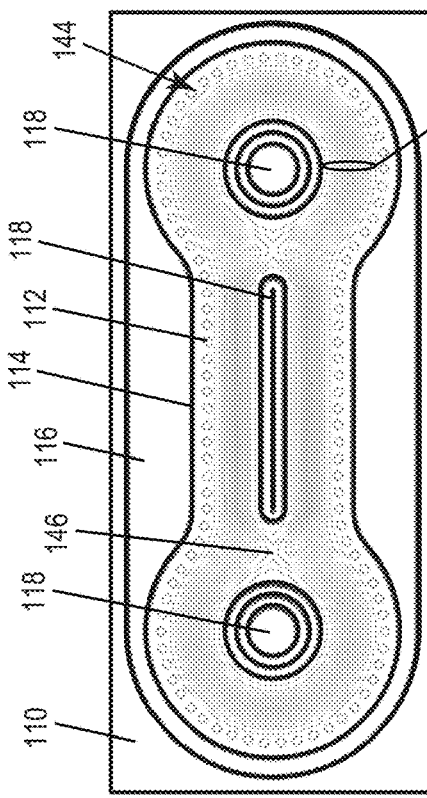
FIG. 3 illustrates a top plan view of the fill pattern, according to another embodiment.
Figure 4:
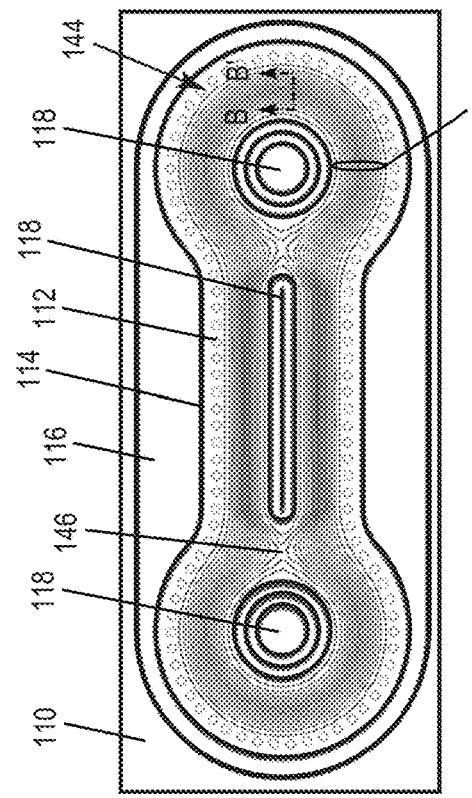
FIG. 4 illustrates a top plan view of the fill pattern, according to another embodiment.

Described next in conjunction with FIGS. 2 through 4 are various configuration embodiments for the fill pattern 144. These embodiments are described in the context of a power JFET, for ease of explanation only. The power transistor may instead be a power MOSFET, vertical or lateral but with a lateral drift area, an IGBT, a HEMT, etc., e.g., as previously explained herein.

Each of FIGS. 2 through 4 illustrate a top plan view of an embodiment of the fill pattern 144 over the lateral drift zone 120 of a power JFET. Moving from the perimeter to the center of each of FIGS. 2 through 4, the JFET device includes the body region 116, the source region 114, the JFET gate structures 112, the lateral drift zone 120 which is covered by STI 146 in FIGS. 2 through 4, and the drain region 118 at the center of the JFET device.

According to the embodiment illustrated in FIG. 2, the fill pattern 144 comprises lines 200 of semiconductor material having a uniform width and variable spacing between the lines 200. The lines 200 are formed by gaps in the STI 146 that are filled with material of the semiconductor substrate 106. The gaps are patterned into the STI 146 to follow the equipotential lines of the electric field expected between the fill pattern 144 at the surface of the lateral drift zone 120 during operation of the semiconductor device. Each gap in the STI 146 coincides with an equipotential line of the electric field distribution expected between the fill pattern 144 at the surface of the lateral drift zone 120 during operation of the semiconductor device. Hence, the variable spacing between the lines 200 of semiconductor material coincides with different equipotential lines of the electric field distribution expected between the fill pattern 144 at the surface of the lateral drift zone 120 during operation of the semiconductor device. Accordingly, the electric field lines that exit the lateral drift zone 120 at the front surface 108 of the semiconductor substrate 106 are guided by the lines 200 of semiconductor material without interference. Separately or in combination, the fill pattern 144 may be formed over the termination region 110 which separates the power JFET from neighboring low voltage logic (not shown in FIG. 2).

According to the embodiment illustrated in FIG. 3, at least some of the gaps in the STI 146 are interrupted along a length of the gaps. Accordingly, at least some of the lines 200 of semiconductor material are interrupted by regions 300 of insulating material 146. Separately or in combination, the fill pattern 144 may be formed over the termination region 110 which separates the power JFET from neighboring low voltage logic (not shown in FIG. 3).

According to the embodiment illustrated in FIG. 4, the fill pattern 144 further comprises polysilicon or metal gate lines 400 formed on the STI 146 and aligned with the gaps in the underlying STI 146. The embodiment illustrated in FIG. 4 builds upon the embodiments shown in FIG. 2 or FIG. 3, by forming additional fill pattern lines 400 above the semiconductor substrate 106. Like the underlying semiconductor-based fill lines 200, each one of the overlying polysilicon or metal gate lines 400 is aligned along an equipotential line of the electric field distribution expected between the fill pattern 144 at the surface of the lateral drift zone 120 and/or termination region 110 during operation of the semiconductor device 100. Each one of the polysilicon or metal gate lines 400 has the same shape as one of the gaps in the underlying STI 146. At least some of the polysilicon or metal gate lines 400 may be interrupted along a length of the polysilicon or metal gate lines 400, e.g., similar to what is shown in FIG. 3 for the semiconductor-based fill lines 200.

Figure 5A:
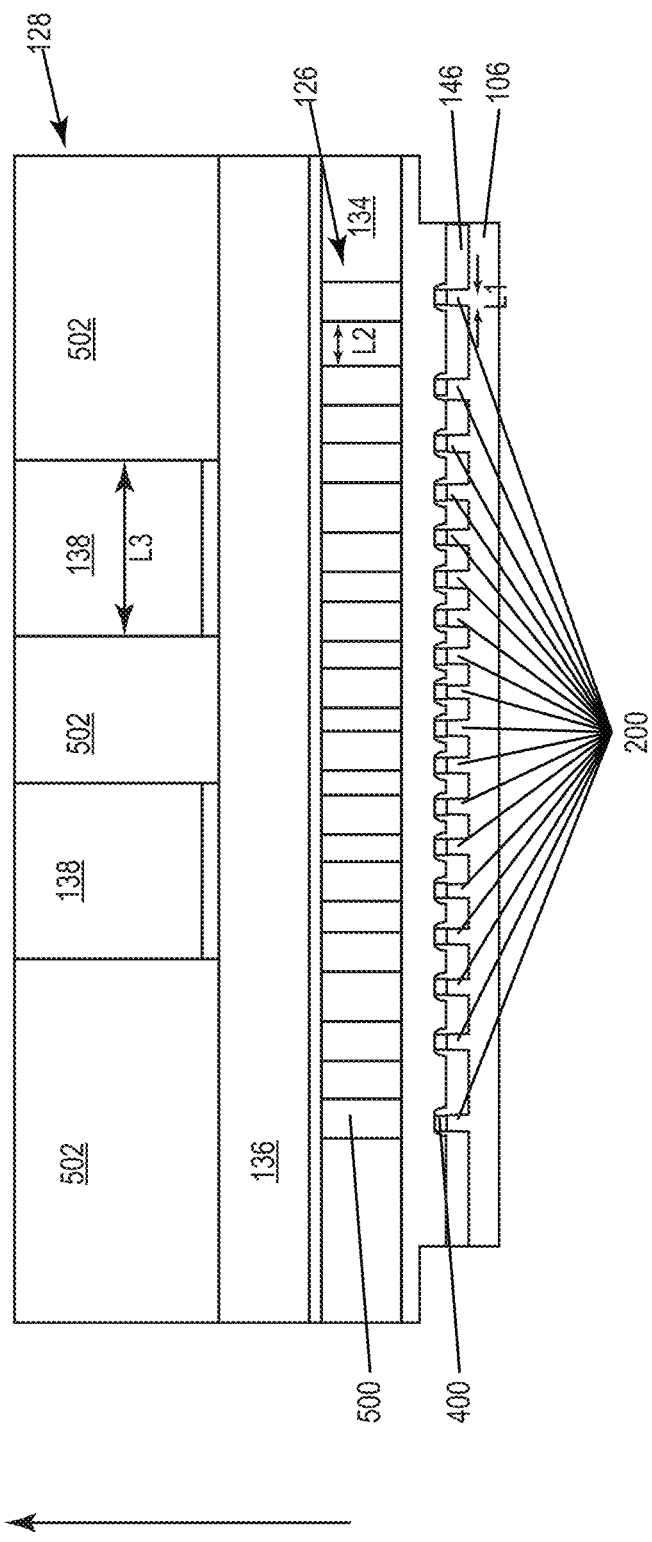
FIG. 5A illustrates a cross-sectional view along the line labelled B-B' in FIG. 4.

FIG. 5A illustrates a cross-sectional view along the line labelled B-B' in FIG. 4. According to this embodiment, the fill pattern 144 comprises lines 200 formed by gaps in the STI 146 and that are filled with material of the semiconductor substrate 106, similar to what is shown in FIGS. 2 and 3. Further according to this embodiment, the fill pattern 144 also comprises polysilicon or metal gate lines 400 as shown in FIG. 4. The polysilicon/metal gate lines 400 are formed as part of a standard planar gate process, except the polysilicon/metal gate lines 400 do not form active gate structures but instead fill structures over the lateral drift zone 120 and/or termination region 110.

For each additional metallization layer 126, 128, the fill pattern 144 may further include corresponding metal lines 500, 502 patterned into the respective metallization layers 126, 128. Each metal line 500, 502 patterned into the corresponding metallization layer 126, 128 is aligned along a respective equipotential line of the electric field distribution expected between the fill pattern 144 at the surface of the corresponding interlayer dielectric 134, 138 during operation of the semiconductor device 100.

The pitch of the metallization layers 126, 128 may increase as a function of distance to the semiconductor substrate 106, as shown in FIG. 5A. Accordingly, the pitch of the metal lines 500, 502 of the fill pattern 144 may also increase as a function of distance to the semiconductor substrate 106. If this is the case, the amount of equipotential lines of the electric field distribution expected between the metal lines at the surface of the first interlayer dielectric 134 is larger than the amount of equipotential lines of the electric field distribution expected between the poly lines at the surface of the lateral drift zone 120 or termination region 110 such that the lateral (L2) spacing between adjacent ones of the metal lines 500 patterned into the first metallization layer 126 corresponds to a larger change in the potential than the lateral spacing (L1) between adjacent ones of the gaps formed in the STI 146.

In a similar manner, the amount of equipotential lines of the electric field distribution expected in the space of the metal at the surface of the third interlayer dielectric 138 is larger than the amount of equipotential lines of the electric field distribution expected in the space of the metal at the surface of the first interlayer dielectric 134 such that the lateral spacing (L3) between adjacent ones of the metal lines 502 patterned into the second metallization layer 128 corresponds to a larger change in potential than the lateral spacing (L2) between adjacent ones of the metal lines 500 patterned into the first metallization layer 126.

At least some of the metal fill lines 500 patterned into the first metallization layer 126 may be interrupted along a length of the metal fill lines 500, e.g., similar to what is shown in FIG. 3 for the semiconductor-based fill lines 200.

Separately or in combination, at least some of the metal fill lines 502 patterned into the second metallization layer 128 may be interrupted along a length of the metal fill lines 502, also similar to what is shown in FIG. 3 for the semiconductor-based fill lines 200.

Figure 5C:
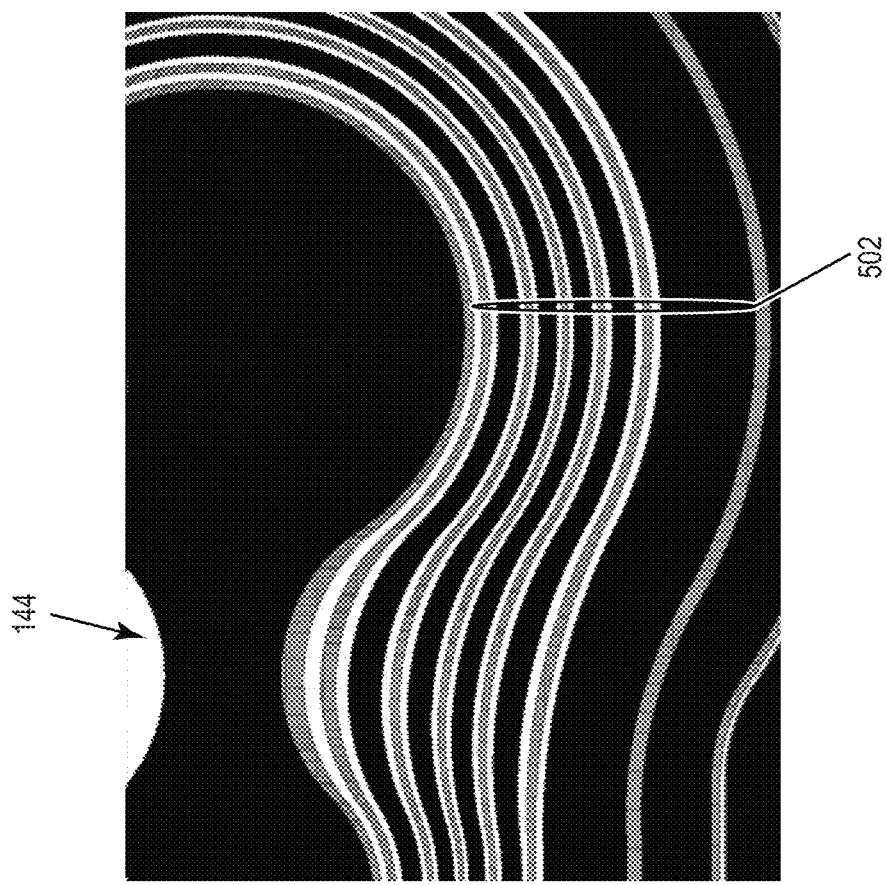
FIG. 5C illustrates the same enlarged view as FIG. 5B, but at a second metallization layer.
Figure 5B:
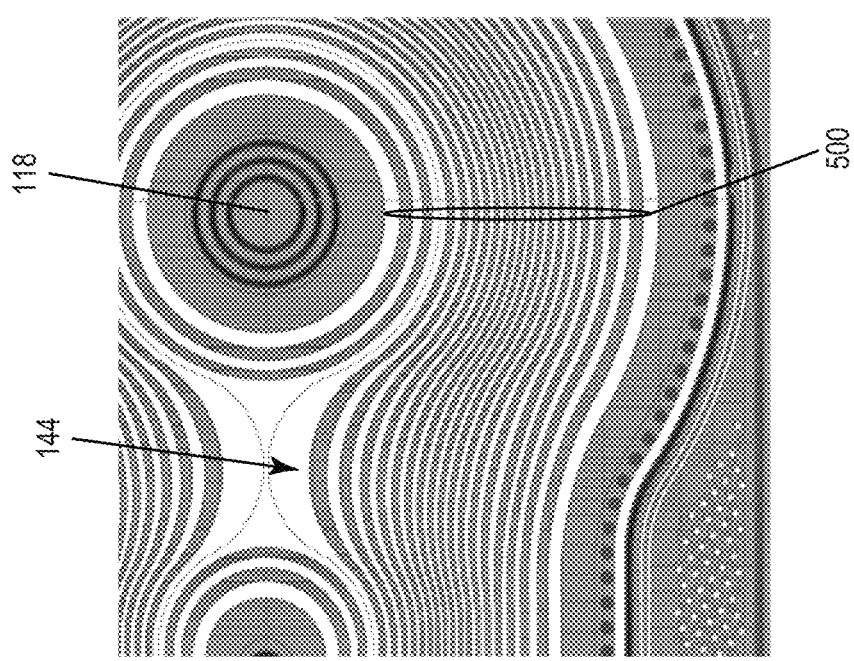
FIG. 5B illustrates an enlarged plan view of a portion of the fill pattern shown in FIG. 5A, at a first metallization layer.

FIG. 5B illustrates an enlarged plan view of a portion of the fill pattern 144 shown in FIG. 5A, at the first metallization layer 126. FIG. 5C illustrates the same enlarged view as FIG. 5B, but at the second metallization layer 128. According to the embodiment illustrated in FIGS. 5A through 5C, the fill pattern 144 includes corresponding metal lines 500, 502 patterned into the respective metallization layers 126, 128 and each metal line 500, 502 is aligned to a respective equipotential line of the electric field distribution expected between the fill pattern 144 at the surface of the corresponding interlayer dielectric 134, 138 during operation of the semiconductor device 100. As seen by comparing FIGS. 5B and 5C, the pitch of the metallization layers 126, 128 increases as a function of distance to the semiconductor substrate 106 and thus the amount of equipotential lines of the electric field distribution in the space of the metal lines expected at the surface of the third interlayer dielectric 138 is larger than the amount of equipotential lines of the electric field distribution in the space of the metal lines expected between the fill pattern 144 at the surface of the first interlayer dielectric 134.

As previously explained herein, the high voltage transistor device 102 which utilizes the fill pattern 144 described herein may be a lateral or vertical power transistors such as a power MOSFET, a JFET, an IGBT, a HEMT, etc. FIGS. 1A through 4 show exemplary JFET implementations.

Figure 6:
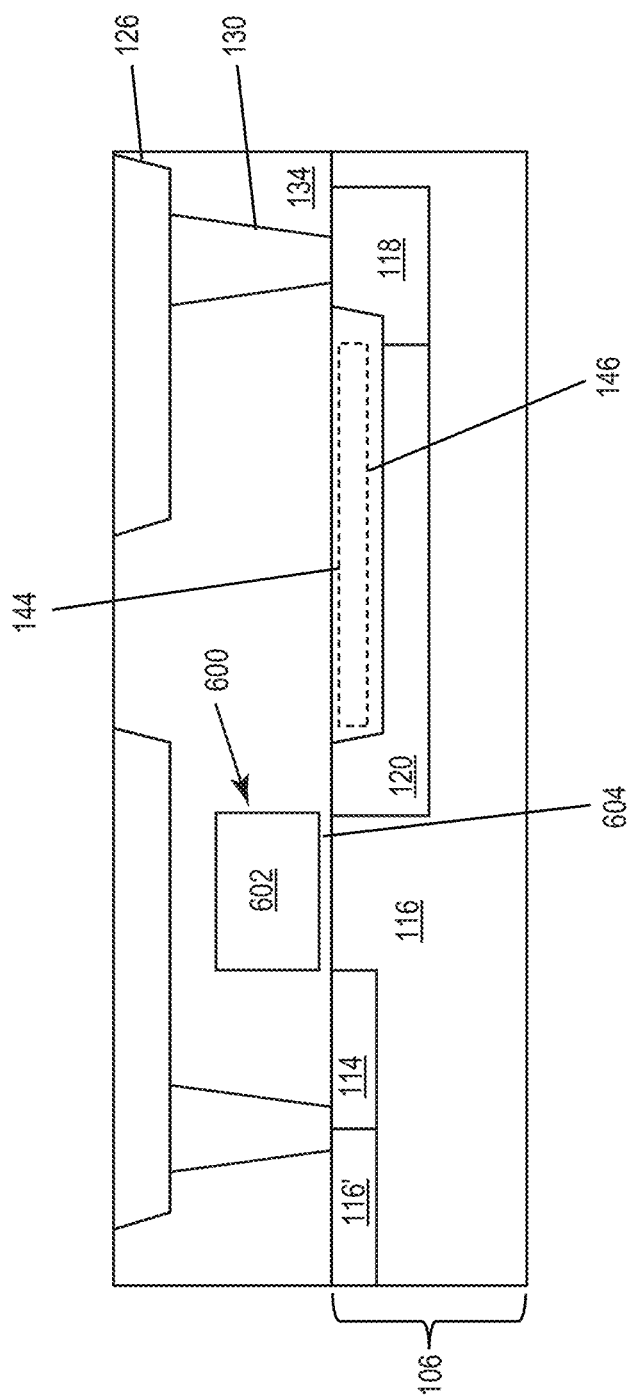
FIG. 6 illustrates a partial cross-sectional view of an embodiment of a lateral power MOSFET which includes the fill pattern.

FIG. 6 shows an exemplary lateral power MOSFET which includes the fill pattern 144. The fill pattern 144 may be implemented according to any of the embodiments described herein. Instead of gate structures of the second conductivity type in contact with the surrounding semiconductor material, the lateral power MOSFET includes planar gate structure 600 that includes a gate electrode 602 insulated from the front surface 108 of the semiconductor substrate 106 by a gate dielectric 604. In the case of a trench gate device, the gate electrode 602 and gate dielectric 604 would be disposed in a trench formed in the semiconductor substrate 106. The body region 116 of the lateral power MOSFET may include a highly doped body contact region 116' of the second conductivity type for providing an ohmic contact to the first metallization layer 130.

Figure 7:
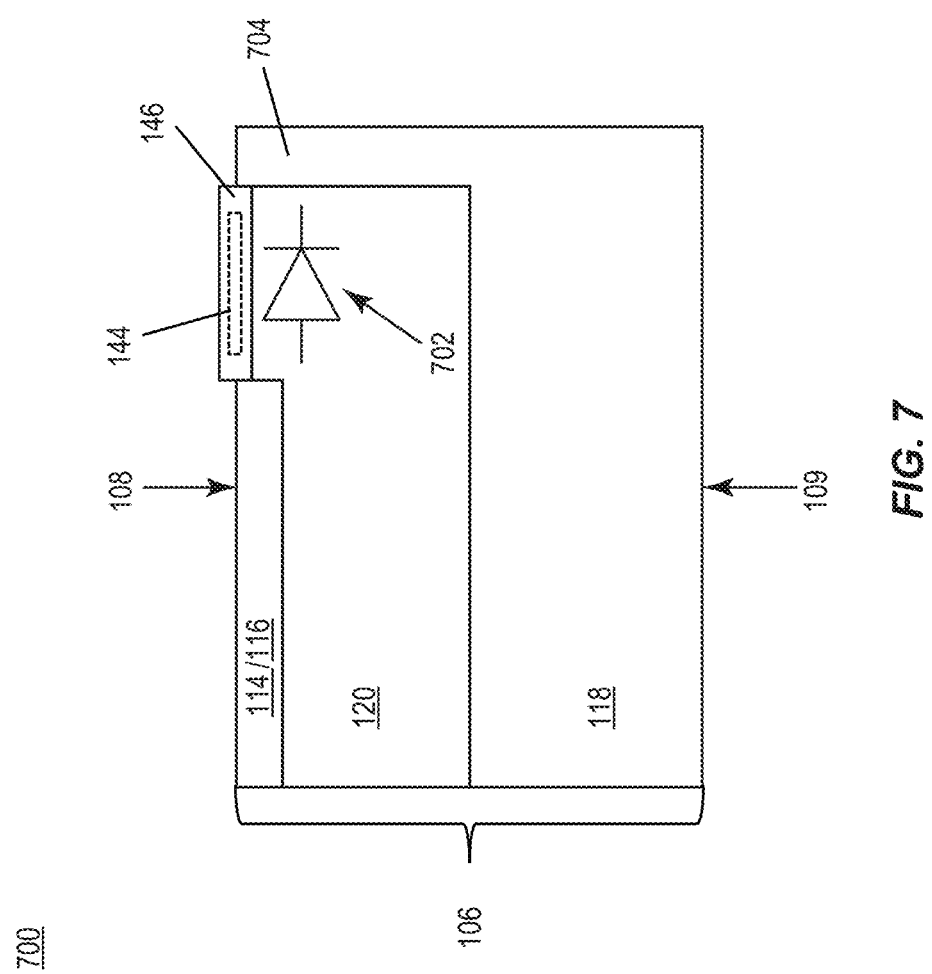
FIG. 7 illustrates a cross-sectional view of a horizontal high-voltage edge region of a vertical power MOSFET which includes the fill pattern.

FIG. 7 illustrates a cross-sectional view of the horizontal high-voltage edge region 700 of a vertical power MOSFET. The main current flow path of the vertical power MOSFET is between the front surface 108 and the back surface 109 of the semiconductor substrate 106 but may have a lateral drift zone component. The edge region is for high voltage isolation only in this embodiment.

The high-voltage edge region 700 of the vertical power MOSFET includes a pn-diode 702. The anode of the pn-diode 702 is formed by the body region 116 of the vertical power MOSFET. The cathode of the pn-diode 702 is formed by a part 704 of the drain region 118 which extends to the front surface 108 of the semiconductor substrate 106. The vertical power MOSFET may be inactive in the high-voltage edge region 700, e.g., by grounding the gate or omitting the gate and thus leaving a simple pn-diode 702 in the high-voltage edge region 700.

An insulating material 146 such as STI may at least partially cover the lateral drift zone 120 in the high-voltage edge region 700 of the vertical power MOSFET. The fill pattern 144 may be included in the insulating material 146, e.g., in the form of semiconductor-based fill lines as shown in FIGS. 2-3. Separately or in combination, the fill pattern 144 may include polysilicon or metal gate lines formed above the lateral drift zone 120, e.g., as shown in FIG. 4. Separately or in combination, the fill pattern 144 may include metal lines patterned into one or more metallization layers formed above the lateral drift zone 120, e.g., as shown in FIGS. 5A through 5C. In each case, the fill pattern 144 has a variable density that follows the equipotential lines of an electric field distribution expected between the fill pattern 144 at the surface 108 of the lateral drift zone 120 during operation of the vertical power MOSFET.

Figure 8:
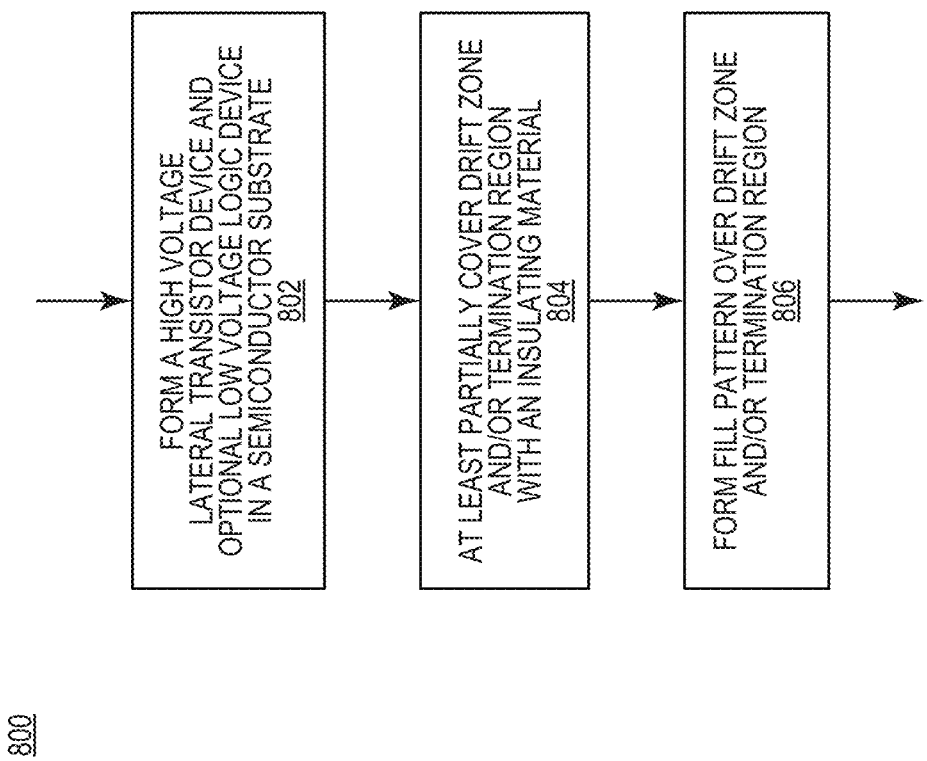
FIG. 8 illustrates a flow diagram of an embodiment of a method of producing a semiconductor device having the fill pattern.

FIG. 8 illustrates an embodiment of a method 800 of producing a semiconductor device having the fill pattern. The method 800 includes forming a lateral high voltage transistor device and an optional low voltage logic device in a semiconductor substrate (Block 802). The method 800 further includes at least partially covering a lateral drift zone of the lateral high voltage transistor device or a termination region between the lateral high voltage transistor device and the optional logic device or between the lateral high voltage transistor device and the edge of the semiconductor substrate with an insulating material (Block 804). The insulating material may include STI and/or an interlayer dielectric. The method 800 further includes forming a fill pattern over the lateral drift zone or termination region, the fill pattern having a variable density that aligns along equipotential lines of an electrical field distribution expected between the fill pattern at a surface of the lateral drift zone or termination region during operation of the semiconductor device (Block 806).

FIGS. 9 through 13 illustrate an embodiment of determining and forming the fill pattern 144. According to this embodiment, curves are fitted from data points modelled based on a power law and calculated across different sections of equipotential lines of the electric field distribution expected between the fill pattern 144 at the surface of the lateral drift zone 120 or termination region 110. The fitted curves are transferred to layout data used in fabricating the device. The fill pattern 144 is then fabricated based on the layout data.

The curves may be fitted by applying a spline function to the modelled data points. Each curve connects the modelled data points calculated along the same equipotential line. Hence, the resulting fill pattern 144 has a densification according to the expected electric field distribution. Fill structures may be derived based on a simulated electric distribution and that follow the equipotential lines. The fill structures may or may not be disrupted. In either case, the fill pattern 144 achieves a certain density without disturbing the expected equipotential lines. A conventional fill pattern with equal distance/equal capacitance may have the same voltage drop across structure but may disturb the expected electric field distribution and cause high electric fields.

Figure 9:
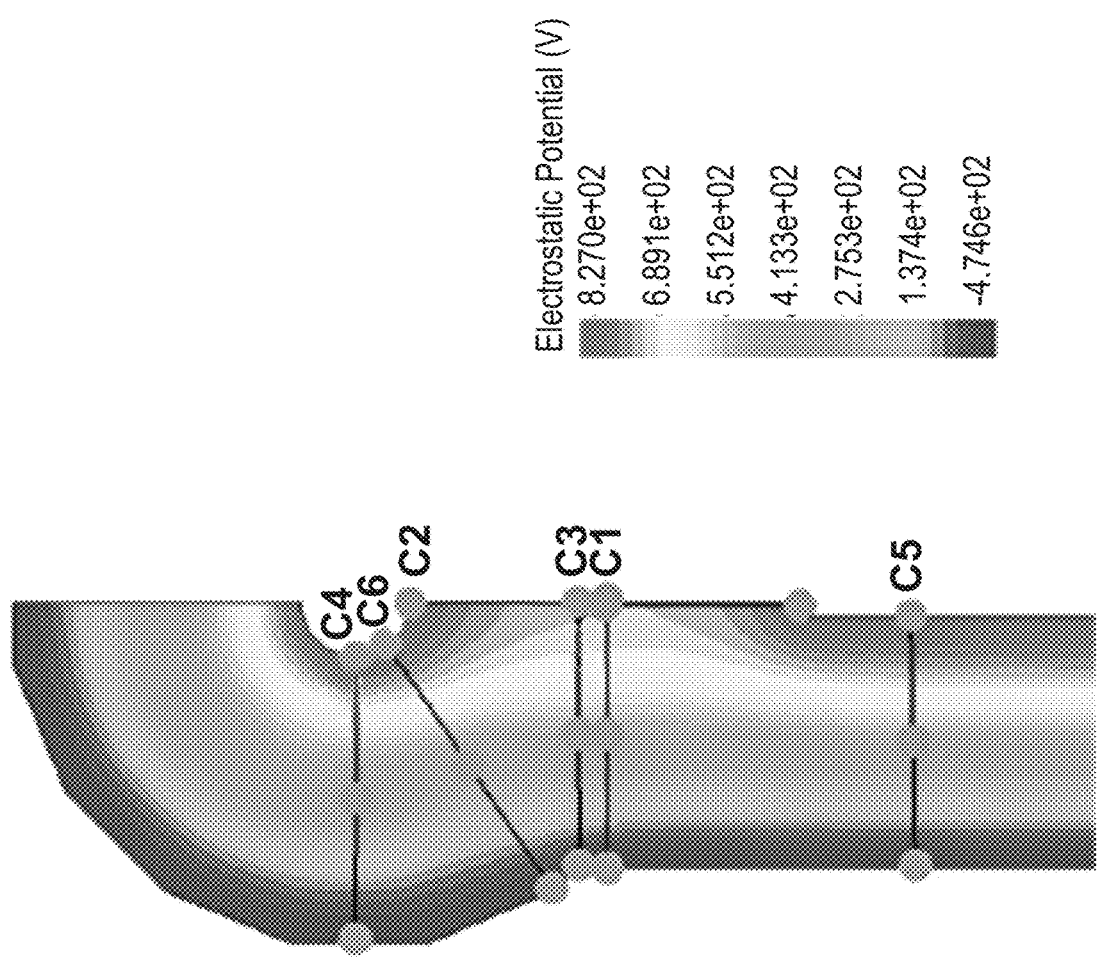
FIGS. 9 through 13 illustrate an embodiment of determining and forming the fill pattern.

In contrast, the fill pattern 144 described herein is based on a model of the equipotential lines of an expected electric field distribution. The expected electric field distribution may be described by any suitable function which may or may not be non-linear, such as parabolic, linear, X to power, etc. Distances between equipotential lines may be different, but follow the electric field distribution. The function yields a certain curve, and the model fits the curves using a power law which simulates voltage over distance from a center point and for a certain distance. This is shown in FIG. 9 for six different center points C1 through C6. The corresponding line extending outward from each center point represents a respective cross-section which may be used to map the entire electric field behavior.

Figure 10:
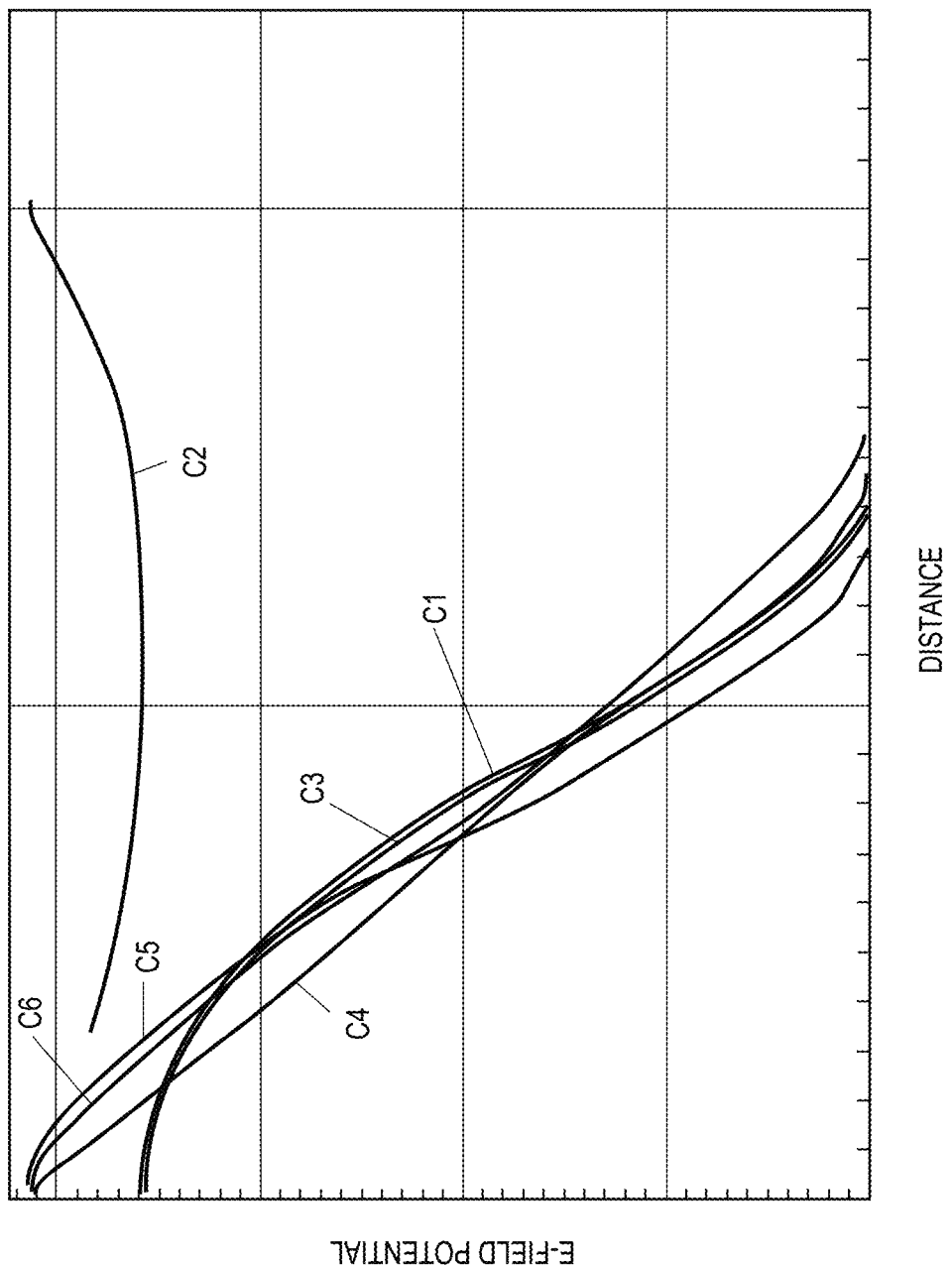

FIG. 10 illustrates a plot of the lines associated with each center point C1 through C6. Each line represents the electrical potential due to an electric field (E-field) distribution over the distance of the line. As shown in FIG. 10, the lines associated with center points C1 and C3 are nearly identical, since these two cross-sections are taken in nearly the same part of the device. The line associated with center point C2 has less e-field variance compared to the other lines, since this cross-section is taken in a part of the device where the expected electric potential changes little. The other lines represent are much larger change in electric potential due to the electrical field when moving away from eh corresponding center points, since these cross-sections are through parts of the device which experience the entire or nearly entire range of the expected potential change. For a power transistor device, the expected electric potential may vary from several hundreds or even a thousand or more Volts at the drain side to nearly zero Volts at the source side. The distribution of equipotential lines in the lateral drift zone 110 and or termination region 1110 of the device are captured by the modelling and reflected in the variable density of the fill pattern 144.

The process for determining the fill pattern 144 may start with a basic device with no fill structures, and then fill structures are added which do not interfere with expected electric field distribution, so that the equipotential lines stay almost at the same position.

Figure 11C:
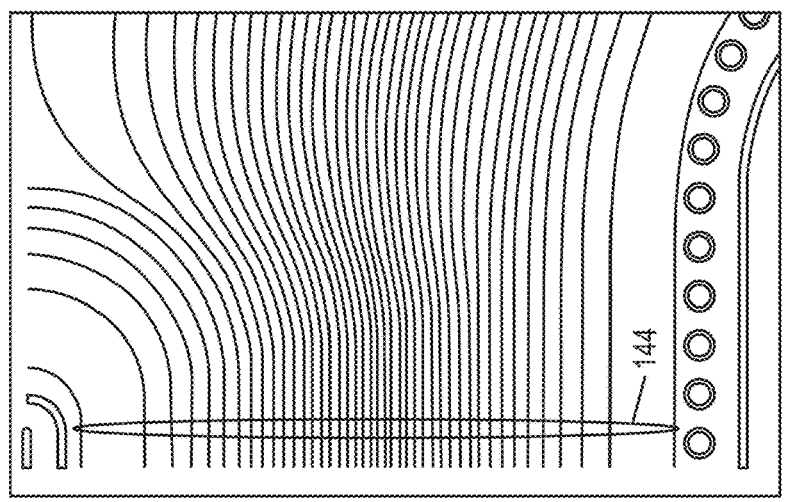
Figure 11B:
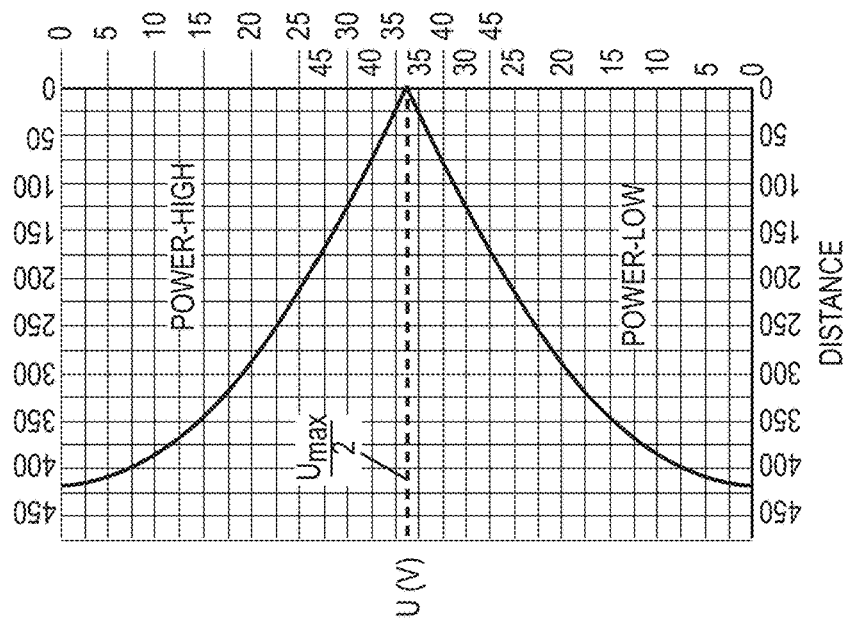
Figure 11A:
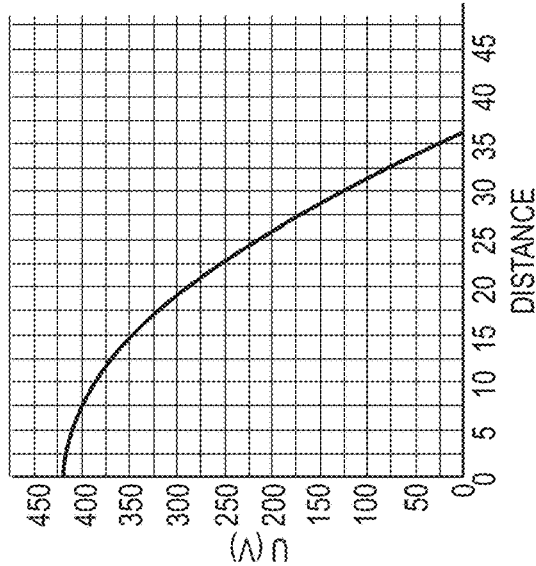

FIGS. 11A through 11C illustrate another embodiment for determining the design of the fill pattern 144. Power laws may be used to represent the electrical behavior in the lateral drift zone 120 and/or termination region 110 of a device, by using corresponding formulas/equations. For example, formulas with a single power parameter may be used to define a distribution of lines running perpendicular to the lateral drift zone lengthwise direction. FIG. 11A shows a power fit parameter given by:

$$y = U_{max} - a * x^{Power} \tag{1}$$

where $U_{max}$ is maximum electric potential, $$x = \sqrt[Power]{\frac{U_{max} - y}{a}} \tag{2}$$

and $$a = \frac{U_{max}}{x_{max}^{Power}} \tag{3}$$

FIG. 11B illustrates corresponding power-high and power-low curves, which merge at the midpoint $$\frac{U_{max}}{2}.$$

In FIG. 11B, the potential U is on the x-axis and the geometrical distance is on the y-axis. The position of the equipotential lines are determined by the cross points of vertical lines with equal distances on the x-axis (equipotential lines) with the potential curve. FIG. 11C illustrates part of the design for the fill pattern 144 which is based on the power curve formulations shown in FIGS. 11A and 11B.

Figure 12A:
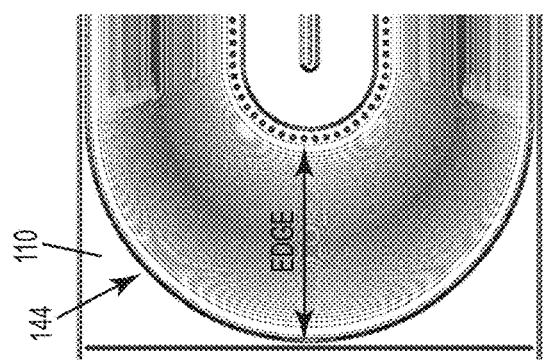
Figure 12B:
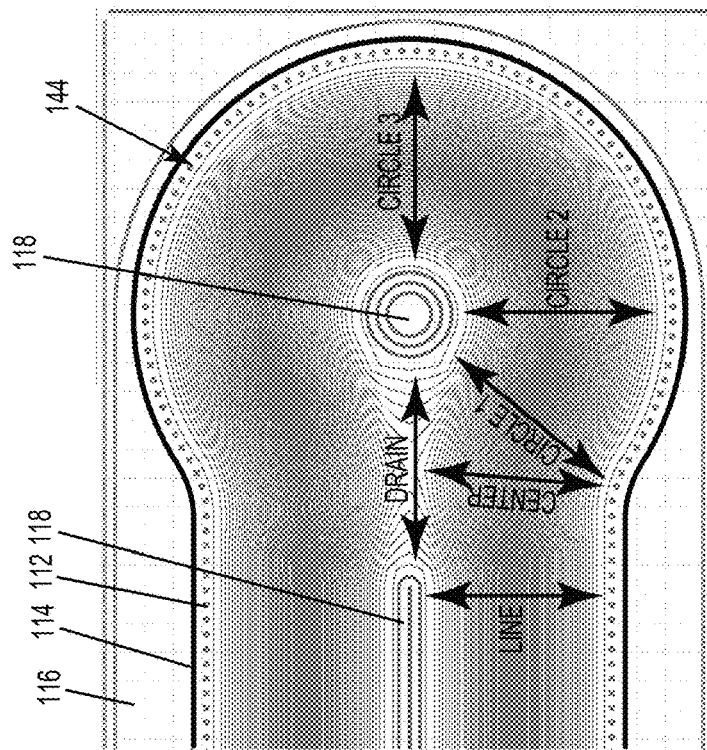
Figure 12C:
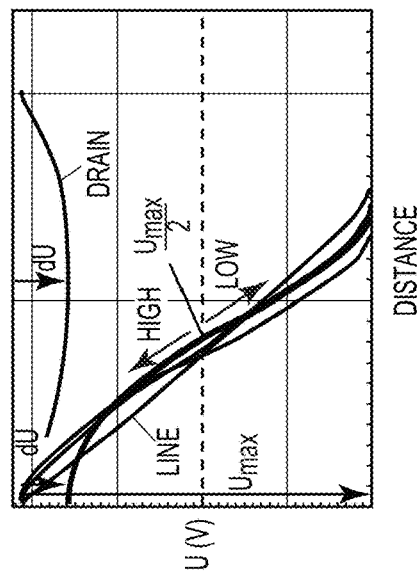

FIG. 12A illustrates the resulting fill pattern 144 in the termination region 110 of the device. FIG. 12B illustrates the resulting fill pattern 144 in the drain region of the high voltage transistor device 102. As shown in FIGS. 12A and 12B, the curves modelled as part of the fill pattern design process may be based on various geometric shapes such as circles, lines, etc. depending on the cross-section in which the curve is taken. FIG. 12C plots the lines associated with the cross-sections shown in FIG. 12B and labelled 'line', 'center', 'drain', 'circle1', 'circle2' and 'circle3'. Each line represents an electric field (E-field) distribution over the length of the line (i.e., the distance of the cross-section), as explained above in connection with FIG. 10. FIG. 12A shows the delta ('dU') for some of these lines to the expected maximum electric field potential $U_{max}$ and references the direction of the power-high and power-low curves shown in FIG. 11B.

Figure 13:
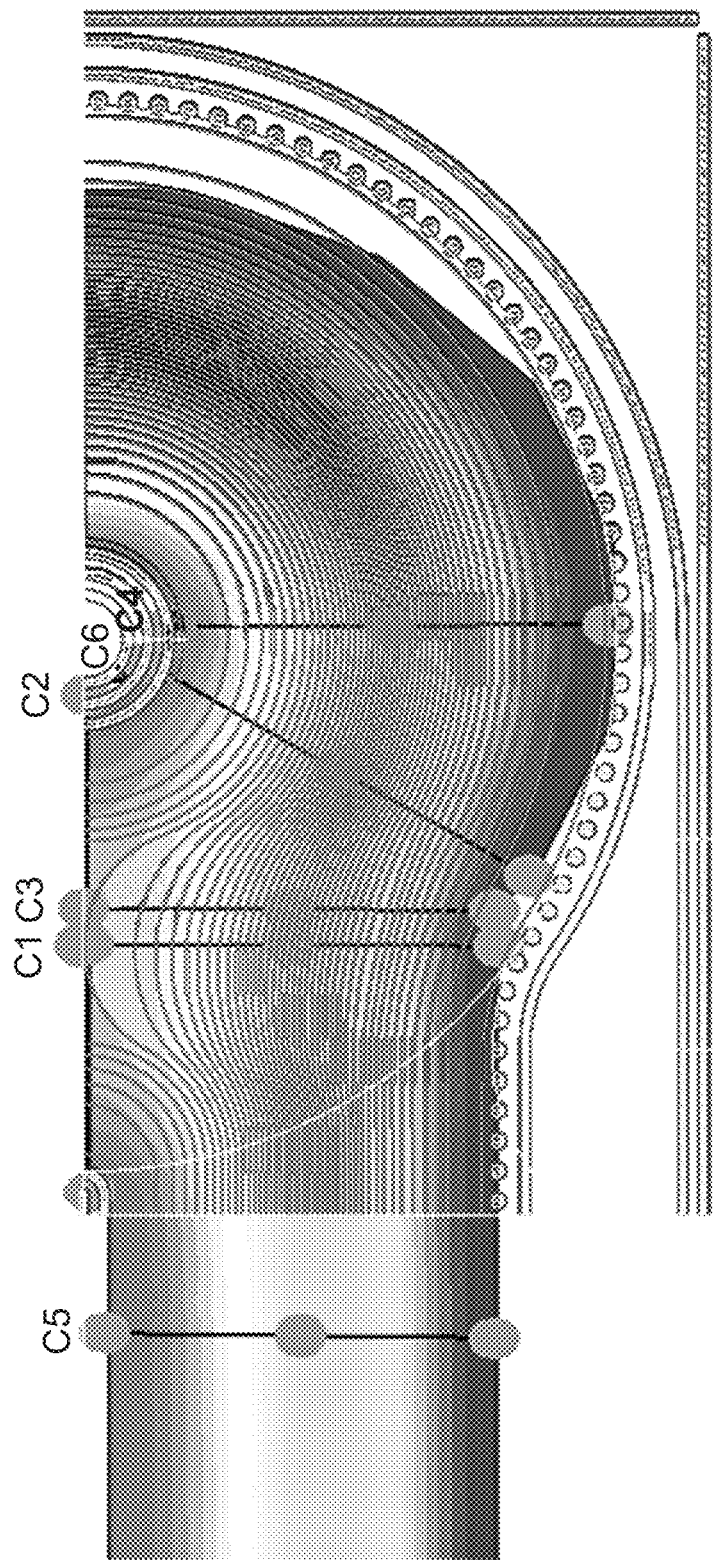

FIG. 13 overlays the center point-based simulation results shown in FIG. 9 with the calculated line approach for the equipotential lines shown in FIGS. 11A through 11C. As shown in FIG. 13, the calculated line approach closely approximates the center point-based simulation results shown in FIG. 9.

As previously explained herein, the fill pattern 144 has a variable density that aligns to the equipotential lines of an electric field distribution expected between the fill pattern 144 at the surface 108 of the lateral drift zone 120 or termination region 110 during device operation. Higher density means equipotential lines are more closely spaced. The design methods described herein extrapolate between curves, use power formulas to describe the curves, and calculate the expected equipotential lines due to the electric field distribution to determine what the lines of the fill pattern 144 should look like. Different points in the layout may be connected with a spline curve which yields a close approximation of the equipotential lines due to the electric field distribution. This information is transferred to a layout having fill structures with line spacing that fulfil the e-field density requirements. A uniform line width may be used, with the spacing between the lines being varied to follow the expected distribution of equipotential lines. The fill structures may have a curvilinear shape with a variable width and/or a variable spacing, as shown in FIGS. 2-4, 5B, 5C, 11C, 12A, 12B and 13. The potential distribution is calculated for a particular area, and the fill lines are fit based on a power law at different points in a cross-section of the area under analysis. For example, the curves may be fitted based on a power law from a plurality of center points each of which is positioned between a highest one and a lowest one of the equipotential lines, and for a certain distance from each of the center points to the highest equipotential line and to the lowest equipotential line, e.g., as previously described herein in connection with FIGS. 9 through 13.

The fill pattern 144 may be formed in STI and/or in the gate polysilicon/metal layer and/or in one or more overlying metallization layers. For STI, the fill pattern 144 includes lines of the lateral drift zone 120 that fill gaps in the STI where the STI is interrupted, e.g., as shown in FIGS. 1B, 2, 3, 5A, 6 and 7. For the gate polysilicon/metal layer, the fill pattern 144 includes dummy lines patterned using gate polysilicon/metal, e.g., as shown in FIGS. 4 and 5A. For metallization layers, the fill pattern 144 includes one or more levels of patterned metal lines, e.g., as shown in FIGS. 5A through 5C.

The fill pattern 144 may be included in the uppermost metallization layer of the device. In a direction moving up the stack away from the semiconductor substrate 106 and with increasing (larger) feature sizes/ground rules, two or more adjacent fill structures/lines from the underlying layer may be merged into one structure in the overlying layer. For example, the spacing between adjacent fill structures/lines in the lowermost layer may correspond to an equipotential difference of 5V. The spacing may represent larger and larger equipotential differences moving up the stack in a direction away from the semiconductor substrate 106, e.g., to a spacing which corresponds to 10V equipotential difference, to a spacing which corresponds to 50V equipotential difference, etc.

The electric fields lines are vertically guided/followed through the entire stack by adjusting the spacing of the fill pattern 144 accordingly. For example, in the case of a maximum electric field of 800V, every 20 fill structures/lines in a lower layer may correspond to an equipotential step of 40V, every 10 fill structures/lines in a middle layer may correspond to an equipotential step of 80V, and every 5 fill structures/lines in an upper layer may correspond to an equipotential step of 160V. Of course, these are just examples to help illustrate the flexibility of the fill pattern embodiments described herein. The shape/distribution of the fill pattern 144 in each layer may be the same, but with the line width changes when moving vertically through the stack. That is, the fill pattern 144 may look the same moving vertically through the stack, but with fewer lines in each overlying layer, e.g., as shown in FIGS. 5A through 5C.

In each case, the electric field distribution has an expected pattern during device operation and the fill pattern 144 guides the electric fields up and out of the vertical stack without disturbing the electric field distribution in the substrate 106. The fill pattern 144 does not redefine the electric field distribution, but rather is an anti-dishing mechanism which does not interfere with the natural or expected distribution of the electric field which arises during device operation.

The fill pattern embodiments described herein also may be applied to a high voltage diode having a lateral drift zone between the anode and cathode of the diode, and with the fill pattern being disposed over the lateral drift zone of the diode.

Although the present disclosure is not so limited, the following numbered examples demonstrate one or more aspects of the disclosure.

Example 1. A semiconductor device, comprising: a transistor or diode device formed in a semiconductor substrate; an insulating material at least partially covering a lateral drift zone of the transistor or diode device or a termination region; and a fill pattern disposed over the lateral drift zone or termination region, the fill pattern having a variable density that follows equipotential lines of an electric field distribution expected between the fill pattern at a surface of the lateral drift zone or termination region during operation of the semiconductor device.

Example 2. The semiconductor device of example 1, wherein the fill pattern comprises lines having a uniform width and variable spacing between the lines, and wherein the variable spacing follows the equipotential lines of the electric field distribution expected between the fill pattern at the surface of the lateral drift zone or termination region during operation of the semiconductor device.

Example 3. The semiconductor device of example 1 or 2, wherein the insulating material contacts the semiconductor substrate, wherein the fill pattern comprises gaps formed in the insulating material and filled with material of the semiconductor substrate, and wherein each one of the gaps follows an equipotential line of the electric field distribution expected between the fill pattern at the surface of the lateral drift zone or termination region during operation of the semiconductor device.

Example 4. The semiconductor device of example 3, wherein at least some of the gaps in the insulating material are interrupted along a length of the gaps.

Example 5. The semiconductor device of example 3 or 4, wherein the fill pattern further comprises polysilicon or metal gate lines formed on the insulating material and aligned with the gaps in the insulating material, wherein each one of the polysilicon or metal gate lines follows the equipotential lines of the electric field distribution expected between the fill pattern at the surface of the lateral drift zone or termination region during operation of the semiconductor device.

Example 6. The semiconductor device of example 5, wherein each one of the polysilicon or metal gate lines has the same shape as one of the gaps in the insulating material.

Example 7. The semiconductor device of example 5 or 6, wherein at least some of the polysilicon or metal gate lines are interrupted along a length of the polysilicon or metal gate lines.

Example 8. The semiconductor device of any of examples 5 through 7, further comprising: a first interlayer dielectric on the insulating material; and a first metallization layer in the first interlayer dielectric, wherein the fill pattern further comprises metal lines patterned into the first metallization layer over the lateral drift zone or termination region, wherein each one of the metal lines patterned into the first metallization layer follows an equipotential line of the electric field distribution expected between the meta lines at a surface of the first interlayer dielectric during operation of the semiconductor device.

Example 9. The semiconductor device of example 8, wherein an amount of the equipotential lines of the electric field distribution expected between the metal lines at the surface of the first interlayer dielectric is larger than an amount of the equipotential lines of the electric field distribution expected between the fill pattern at the surface of the lateral drift zone or termination region such that a lateral spacing between adjacent ones of the metal lines patterned into the first metallization layer corresponds to a larger change in electric potential than a lateral spacing between adjacent ones of the gaps formed in the insulating material.

Example 10. The semiconductor device of example 8 or 9, wherein at least some of the metal lines patterned into the first metallization layer are interrupted along a length of the metal lines patterned into the first metallization layer.

Example 11. The semiconductor device of any of examples 8 through 10, further comprising: a second interlayer dielectric on the first metallization layer; a third interlayer dielectric on the second interlayer dielectric; and a second metallization layer in the third interlayer dielectric, wherein the fill pattern further comprises metal lines patterned into the second metallization layer over the lateral drift zone or termination region, wherein each one of the metal lines patterned into the second metallization layer follows an equipotential line of the electric field distribution expected at a surface of the third interlayer dielectric during operation of the semiconductor device.

Example 12. The semiconductor device of example 11, wherein an amount of the equipotential lines of the electric field distribution expected between the metal lines patterned into the second metallization at the surface of the third interlayer dielectric is larger than an amount of the equipotential lines of the electric field distribution expected between the metal lines patterned into the first metallization at the surface of the first interlayer dielectric such that a lateral spacing between adjacent ones of the metal lines patterned into the second metallization layer corresponds to a larger change in electric potential than a lateral spacing between adjacent ones of the metal lines patterned into the first metallization layer.

Example 13. The semiconductor device of example 11 or 12, wherein at least some of the metal lines patterned into the second metallization layer are interrupted along a length of the metal lines patterned into the second metallization layer.

Example 14. A method of producing a semiconductor device, the method comprising: forming a transistor or diode device in a semiconductor substrate; at least partially covering a lateral drift zone of the transistor or diode device or a termination region with an insulating material; and forming a fill pattern over the lateral drift zone or termination region, the fill pattern having a variable density that follows equipotential lines of an electric field distribution expected between the fill pattern at a surface of the lateral drift zone or termination region during operation of the semiconductor device.

Example 15. The method of example 14, wherein forming the fill pattern comprises: fitting curves from data points modelled based on a power law and calculated across different sections of equipotential lines of the electric field distribution expected between the fill pattern at the surface of the lateral drift zone or termination region; transferring the fitted curves to layout data; and fabricating the fill pattern based on the layout data.

Example 16. The method of example 15, wherein fitting the curves comprises applying a spline function to the modelled data points, each curve connecting the modelled data points calculated along the same equipotential line.

Example 17. The method of example 15 or 16, wherein the curves are fitted based on the power law from a plurality of center points each of which is positioned between a highest one and a lowest one of the equipotential lines, and for a certain distance from each of the center points to the highest equipotential line and to the lowest equipotential line.

Example 18. The method of any of examples 14 through 17, wherein forming the fill pattern comprises: forming gaps in the insulating material that are filled with material of the semiconductor substrate, wherein each one of the gaps follows an equipotential line of the electric field distribution expected between the fill pattern at the surface of the lateral drift zone or termination region during operation of the semiconductor device.

Example 19. The method of example 18, wherein forming the fill pattern further comprises: forming an interlayer dielectric above the insulating material; forming a metallization layer in the interlayer dielectric; and patterning metal lines into the metallization layer over the lateral drift zone or termination region, each one of the metal lines patterned into the metallization layer follows an equipotential line of the electric field distribution expected between the metal lines at a surface of the interlayer dielectric during operation of the semiconductor device.

Example 20. A semiconductor device, comprising: a transistor or diode device formed in a semiconductor substrate, the transistor or diode device comprising a lateral drift zone; a shallow trench isolation structure formed in the lateral drift zone; and a fill pattern in the shallow trench isolation structure and disposed over the lateral drift zone, the fill pattern having a variable density that follows equipotential lines of the electric field distribution expected between the fill pattern at a surface of the lateral drift zone during operation of the semiconductor device.

Example 21. A semiconductor device, comprising: a transistor or diode device formed in a semiconductor substrate;

an insulating material at least partially covering a lateral drift zone of the transistor or diode device or a termination region; and a fill pattern disposed over the lateral drift zone or termination region, the fill pattern including a plurality of curvilinear fill structures having a variable width and/or a variable spacing.

22. The semiconductor device of example 21, wherein the plurality of curvilinear fill structures has a variable width and a variable spacing.

23. The semiconductor device of example 21 or 22, wherein the plurality of curvilinear fill structures comprises curvilinear lines having a uniform width and variable spacing between the curvilinear lines.

24. The semiconductor device of any of examples 21 through 23, wherein the insulating material contacts the semiconductor substrate, wherein the plurality of curvilinear fill structures comprises curvilinear gaps formed in the insulating material and filled with material of the semiconductor substrate, and wherein the curvilinear gaps have a variable width and/or a variable spacing.

25. The semiconductor device of example 24, wherein at least some of the curvilinear gaps in the insulating material are interrupted along a length of the gaps.

26. The semiconductor device of example 24 or 25, wherein the fill pattern further comprises curvilinear polysilicon or metal gate lines formed on the insulating material and aligned with the curvilinear gaps in the insulating material, and wherein the curvilinear polysilicon or metal gate lines have a variable width and/or a variable spacing.

27. The semiconductor device of example 26, wherein each one of the curvilinear polysilicon or metal gate lines has the same shape as one of the curvilinear gaps in the insulating material.

28. The semiconductor device of example 26 or 27, wherein at least some of the curvilinear polysilicon or metal gate lines are interrupted along a length of the curvilinear polysilicon or metal gate lines.

29. The semiconductor device of any of examples 26 through 28, further comprising: a first interlayer dielectric on the insulating material; and a first metallization layer in the first interlayer dielectric, wherein the fill pattern further comprises curvilinear metal lines patterned into the first metallization layer over the lateral drift zone or termination region, wherein the curvilinear metal lines patterned into the first metallization layer have a variable width and/or a variable spacing.

30. The semiconductor device of example 29, wherein at least some of the curvilinear metal lines patterned into the first metallization layer are interrupted along a length of the curvilinear metal lines patterned into the first metallization layer.

31. The semiconductor device of example 29 or 30, further comprising: a second interlayer dielectric on the first metallization layer; a third interlayer dielectric on the second interlayer dielectric; a third interlayer dielectric on the third interlayer dielectric; and a second metallization layer in the third interlayer dielectric, wherein the fill pattern further comprises curvilinear metal lines patterned into the second metallization layer over the lateral drift zone or termination region, wherein the curvilinear metal lines patterned into the second metallization layer have a variable width and/or a variable spacing.

32. The semiconductor device of example 31, wherein at least some of the curvilinear metal lines patterned into the second metallization layer are interrupted along a length of the curvilinear metal lines patterned into the second metallization layer.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a transistor or diode device formed in a semiconductor substrate;
an insulating material at least partially covering a lateral drift zone of the transistor or diode device or a termination region; and
a fill pattern disposed over the lateral drift zone or termination region, the fill pattern having a variable density that follows equipotential lines of an electric field distribution expected between the fill pattern at a surface of the lateral drift zone or termination region during operation of the semiconductor device.

2. The semiconductor device of claim 1, wherein the fill pattern comprises lines having a uniform width and variable spacing between the lines, and wherein the variable spacing coincides with the equipotential lines of the electric field distribution expected between the fill pattern at the surface of the lateral drift zone or termination region during operation of the semiconductor device.

3. The semiconductor device of claim 1, wherein the insulating material contacts the semiconductor substrate, wherein the fill pattern comprises gaps formed in the insulating material and filled with material of the semiconductor substrate, and wherein each one of the gaps follows an equipotential line of the electric field distribution expected between the fill pattern at the surface of the lateral drift zone or termination region during operation of the semiconductor device.

4. The semiconductor device of claim 3, wherein at least some of the gaps in the insulating material are interrupted along a length of the gaps.

5. The semiconductor device of claim 3, wherein the fill pattern further comprises polysilicon or metal gate lines formed on the insulating material and aligned with the gaps in the insulating material, wherein each one of the polysilicon or metal gate lines follows an equipotential line of the electric field distribution expected between the fill pattern at the surface of the lateral drift zone or termination region during operation of the semiconductor device.

6. The semiconductor device of claim 5, wherein each one of the polysilicon or metal gate lines has the same shape as one of the gaps in the insulating material.

7. The semiconductor device of claim 5, wherein at least some of the polysilicon or metal gate lines are interrupted along a length of the polysilicon or metal gate lines.

8. The semiconductor device of claim 5, further comprising:
a first interlayer dielectric on the insulating material; and
a first metallization layer in the first interlayer dielectric,
wherein the fill pattern further comprises metal lines patterned into the first metallization layer over the lateral drift zone or termination region,
wherein each one of the metal lines patterned into the first metallization layer follows an equipotential line of the electric field distribution expected between the metal lines patterned into the first metallization layer at a surface of the first interlayer dielectric during operation of the semiconductor device.

9. The semiconductor device of claim 8, wherein an amount of the equipotential lines of the electric field distribution expected between the metal lines patterned into the first metallization layer at the surface of the first interlayer dielectric is larger than an amount of the equipotential lines of the electric field distribution expected between the fill pattern at the surface of the lateral drift zone or termination region such that a lateral spacing between adjacent ones of the metal lines patterned into the first metallization layer corresponds to a larger change of electric potential than the change of potential due to a lateral spacing between adjacent ones of the gaps formed in the insulating material.

10. The semiconductor device of claim 8, wherein at least some of the metal lines patterned into the first metallization layer are interrupted along a length of the metal lines patterned into the first metallization layer.

11. The semiconductor device of claim 8, further comprising:
a second interlayer dielectric on the first metallization layer;
a third interlayer dielectric on the second interlayer dielectric; and
a second metallization layer in the third interlayer dielectric,
wherein the fill pattern further comprises metal lines patterned into the second metallization layer over the lateral drift zone or termination region,
wherein each one of the metal lines patterned into the second metallization layer follows an equipotential line of the electric field distribution expected between the fill pattern at a surface of the second interlayer dielectric during operation of the semiconductor device.

12. The semiconductor device of claim 11, wherein an amount of the equipotential lines of the electric field distribution expected between the metal lines patterned into the first metallization layer at the surface of the first interlayer dielectric is larger than an amount of the equipotential lines of the electric field distribution expected between the metal lines patterned into the second metallization layer at the surface of the third interlayer dielectric such that a lateral spacing between adjacent ones of the metal lines patterned into the second metallization layer corresponds to a larger change in electric potential than a lateral spacing between adjacent ones of the metal lines patterned into the first metallization layer.

13. The semiconductor device of claim 11, wherein at least some of the metal lines patterned into the second metallization layer are interrupted along a length of the metal lines patterned into the second metallization layer.

14. A method of producing a semiconductor device, the method comprising:
forming a transistor or diode device in a semiconductor substrate;
at least partially covering a lateral drift zone of the transistor or diode device or a termination region with an insulating material; and
forming a fill pattern over the lateral drift zone or termination region, the fill pattern having a variable density that follows equipotential lines of an electric field distribution expected between the fill pattern at a surface of the lateral drift zone or termination region during operation of the semiconductor device.

15. The method of claim 14, wherein forming the fill pattern comprises:
fitting curves from data points modelled based on a power law and calculated across different sections of the equipotential lines of the electric field distribution expected between the fill pattern at the surface of the lateral drift zone or termination region;
transferring the fitted curves to layout data; and
fabricating the fill pattern based on the layout data.

16. The method of claim 15, wherein fitting the curves comprises applying a spline function to the modelled data points, each curve connecting the modelled data points calculated along the same equipotential line.

17. The method of claim 15, wherein the curves are fitted based on the power law from a plurality of center points each of which is positioned between a highest one and a lowest one of the equipotential lines, and for a certain distance from each of the center points to the highest equipotential line and to the lowest equipotential line.

18. The method of claim 14, wherein forming the fill pattern comprises:
forming gaps in the insulating material that are filled with material of the semiconductor substrate,
wherein each one of the gaps follows an equipotential line of the electric field distribution expected between the fill pattern at the surface of the lateral drift zone or termination region during operation of the semiconductor device.

19. The method of claim 18, wherein forming the fill pattern further comprises:
forming an interlayer dielectric above the insulating material;
forming a metallization layer in the interlayer dielectric; and
patterning metal lines into the metallization layer over the lateral drift zone or termination region, each one of the metal lines patterned into the metallization layer following an equipotential line of the electric field distribution expected between the fill pattern at a surface of the interlayer dielectric during operation of the semiconductor device.

20. A semiconductor device, comprising:
a transistor or diode device formed in a semiconductor substrate, the transistor or diode device comprising a lateral drift zone;
a shallow trench isolation structure formed in the lateral drift zone; and
a fill pattern in the shallow trench isolation structure and disposed over the lateral drift zone, the fill pattern having a variable density that follows equipotential lines of the electric field distribution expected between the fill pattern at a surface of the lateral drift zone during operation of the semiconductor device.

21. A semiconductor device, comprising:
a transistor or diode device formed in a semiconductor substrate;

an insulating material at least partially covering a lateral drift zone of the transistor or diode device or a termination region; and a fill pattern disposed over the lateral drift zone or termination region, the fill pattern including a plurality of curvilinear fill structures having a variable width and/or a variable spacing.

22. The semiconductor device of claim 21, wherein the plurality of curvilinear fill structures has a variable width and a variable spacing.

23. The semiconductor device of claim 21, wherein the plurality of curvilinear fill structures comprises curvilinear lines having a uniform width and variable spacing between the curvilinear lines.

24. The semiconductor device of claim 21, wherein the insulating material contacts the semiconductor substrate, wherein the plurality of curvilinear fill structures comprises curvilinear gaps formed in the insulating material and filled with material of the semiconductor substrate, and wherein the curvilinear gaps have a variable width and/or a variable spacing.

25. The semiconductor device of claim 24, wherein at least some of the curvilinear gaps in the insulating material are interrupted along a length of the gaps.

26. The semiconductor device of claim 24, wherein the fill pattern further comprises curvilinear polysilicon or metal gate lines formed on the insulating material and aligned with the curvilinear gaps in the insulating material, and wherein the curvilinear polysilicon or metal gate lines have a variable width and/or a variable spacing.

27. The semiconductor device of claim 26, wherein each one of the curvilinear polysilicon or metal gate lines has the same shape as one of the curvilinear gaps in the insulating material.

28. The semiconductor device of claim 26, wherein at least some of the curvilinear polysilicon or metal gate lines are interrupted along a length of the curvilinear polysilicon or metal gate lines.

29. The semiconductor device of claim 26, further comprising:

a first interlayer dielectric on the insulating material; and a first metallization layer in the first interlayer dielectric, wherein the fill pattern further comprises curvilinear metal lines patterned into the first metallization layer over the lateral drift zone or termination region, wherein the curvilinear metal lines patterned into the first metallization layer have a variable width and/or a variable spacing.

30. The semiconductor device of claim 29, wherein at least some of the curvilinear metal lines patterned into the first metallization layer are interrupted along a length of the curvilinear metal lines patterned into the first metallization layer.

31. The semiconductor device of claim 29, further comprising:

a second interlayer dielectric on the first metallization layer;

a third interlayer dielectric on the second interlayer dielectric; and a second metallization layer in the third interlayer dielectric, wherein the fill pattern further comprises curvilinear metal lines patterned into the second metallization layer over the lateral drift zone or termination region, wherein the curvilinear metal lines patterned into the second metallization layer have a variable width and/or a variable spacing.

32. The semiconductor device of claim 31, wherein at least some of the curvilinear metal lines patterned into the second metallization layer are interrupted along a length of the curvilinear metal lines patterned into the second metallization layer.

* * * * *